(12) United States Patent
Tung

(10) Patent No.: US 7,569,420 B2
(45) Date of Patent: Aug. 4, 2009

(54) FLIP-CHIP PACKAGING METHOD FOR LIGHT EMITTING DIODE WITH EUTECTIC LAYER NOT OVERLAPPING INSULATING LAYER

(75) Inventor: Ching-Wen Tung, Taichung (TW)

(73) Assignee: Huga Optotech Inc., Taichung (TW)

( * ) Notice: Subject to any disclaimer, the term of this patent is extended or adjusted under 35 U.S.C. 154(b) by 0 days.

(21) Appl. No.: 12/116,950

(22) Filed: May 7, 2008

(65) Prior Publication Data

US 2009/0124031 A1    May 14, 2009

Related U.S. Application Data

(62) Division of application No. 11/463,273, filed on Aug. 8, 2006, now Pat. No. 7,408,204.

(51) Int. Cl.
*H01L 21/00* (2006.01)
(52) U.S. Cl. ............... 438/108; 438/22; 438/25; 438/26; 438/48; 438/51; 438/54; 438/55; 257/E21.503; 257/E21.511; 257/E33.057

(58) Field of Classification Search ............ 438/22, 438/25, 26, 48, 51, 54, 55, 108; 257/E21.503, 257/E21.511, E33.057
See application file for complete search history.

(56) References Cited

U.S. PATENT DOCUMENTS

| | | | |
|---|---|---|---|
| 4,905,075 A * | 2/1990 | Temple et al. | 257/680 |
| 6,514,782 B1 * | 2/2003 | Wierer, Jr. et al. | 438/22 |
| 2007/0262342 A1 * | 11/2007 | Kobayashi et al. | 257/103 |
| 2008/0036362 A1 * | 2/2008 | Tanimoto et al. | 313/498 |

* cited by examiner

*Primary Examiner*—Thanh V Pham

(57) ABSTRACT

A packaging structure and method for a light emitting diode is provided. The present invention uses flip-chip and eutectic bonding technology to attach a LED to a thermal and electrical conducting substrate. The flip-chip packaging structure comprises a thermal and electrical conducting substrate having an insulating layer formed in an appropriate area on the top surface of the substrate and a bonding pad formed on top of the insulating layer; and a LED reversed in a flip-chip style and joined to the substrate by eutectic bonding. A first electrode of the LED is eutectically bonded to an appropriate area on the top surface of the substrate via a eutectic layer, while a second electrode of the LED is electrically connected to the bonding pad.

10 Claims, 5 Drawing Sheets

FLIP-CHIP PACKAGING METHOD FOR LIGHT EMITTING DIODE WITH EUTECTIC LAYER NOT OVERLAPPING INSULATING LAYER

CROSS-REFERENCES TO RELATED APPLICATIONS

This is a division of U.S. application Ser. No. 11/463,273, filed Aug. 8, 2006, now U.S. Pat. No. 7,408,204 which is incorporated herewith by reference.

BACKGROUND OF THE INVENTION

1. Field of the Invention

The present invention generally relates to packaging structures for light emitting diodes, and more particularly to a flip-chip packaging structure and a related method for light emitting diodes with enhanced heat dissipating efficiency.

2. The Prior Arts

Light emitting diodes (LEDs) have advantages of small size, low power consumption, long operation life, and therefore will substitute light bulbs or fluorescent lamps in the future as the mainstream light source. However, to enhance the brightness of LEDs, it is necessary to increase power, numbers, or density of LEDs. These will inevitably increase the heat produced by the LEDs. This heat, if not effectively dissipated, will damage the LEDs themselves, shorten their operation life, and affect their brightness.

To improve heat dissipation, a packaging structure as shown in FIG. 1 has been adopted. As illustrated, LED 10 is attached to an aluminum substrate 20 by eutectic bonding with a eutectic layer 30 interposed therebetween. An insulating layer 21 is formed in specific areas on top of the aluminum substrate 20. Bonding pads 22 are in turn formed on top of the insulating layer 21, which are electrically connected to the first and second electrodes 11 and 12 of the LED 10 respectively via bonding wires 23. In this conventional approach, even though the eutectic layer 30 is able to dissipate the heat produced by the LED 10 through the aluminum substrate 20 by conduction, the sapphire substrate 13 of the LED 10 has inferior thermal conductivity and the heat dissipation efficiency is therefore impaired. Furthermore, the packaging structure described above has the first electrode 11 and the second electrode 12 both formed on the top of LED 10 which blocks light emitted from LED 10 and decreases its brightness.

To overcome the foregoing problems, a flip-chip packaging structure as shown in FIG. 2 is adopted, where LED 10 is reversed and attached to a printed circuit board (PCB) 40. The PCB 40 has bonding pads 41 formed on specific locations on the top surface, and the bonding pads 41 are electrically connected to bonding wires 42. The first and second electrodes 11 and 12 of the LED 10 are connected separately to bonding pads 41 using metallic bumps 43. Although the packaging structure indeed avoid blocking light emitted from LED, heat generated by the LED 10 can only be conducted to the PCB 40 through the small contact area with the metallic bumps 43. Additionally, the PCB 40 itself has limited thermal conductivity and cannot provide satisfactory help to the heat dissipation.

SUMMARY OF THE INVENTION

In order to increase LED brightness and heat dissipating efficiency simultaneously, the present invention provides a flip-chip packaging structure and a related method which use eutectic bonding to attach a LED to a thermal conducting substrate. The flip-chip packaging structure and the method of the present invention avoid blocking the light emitted from the LED, and rely on a larger contact area and higher thermal conductivity to conduct heat to a thermal conducting substrate for efficient heat dissipation.

The flip-chip packaging structure of the present invention comprises a thermal and electrical conducting substrate having an insulating layer formed on a specific area on the top surface and a bonding pad formed on top of the insulating layer surface; and a LED revered in a flip-chip style and attached to the substrate. A first electrode of the LED is joined to the substrate by eutectic bonding via a eutectic layer formed therebetween. The second electrode, on the other hand, is joined to the bonding pad. The eutectic layer is formed by plating a metallic layer on top of the t substrate corresponding to the first electrode prior to the eutectic bonding process. In an alternative embodiment, the eutectic layer can also by formed by interposing a metallic plate between the first electrode and the corresponding location on the top surface of the substrate before conducting the eutectic process. The substrate can be made of Al, Cu, AlN, or other appropriate material having high thermal conductivity.

In contrast to the prior arts, the LED packaged by the present invention does not have its light blocked by the electrodes and therefore has better brightness. The heat produced by the LED can also be conducted more efficiently via the eutectic layer which has a much larger contact area between the thermal conducting substrate and the LED, instead of, as in the prior arts, going through the sapphire substrate of the LED which has inferior thermal conductivity. Therefore, the heat generated by the LED can be conducted and dissipated to the thermal conducting substrate more effectively and efficiently.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENT

Figure 1:
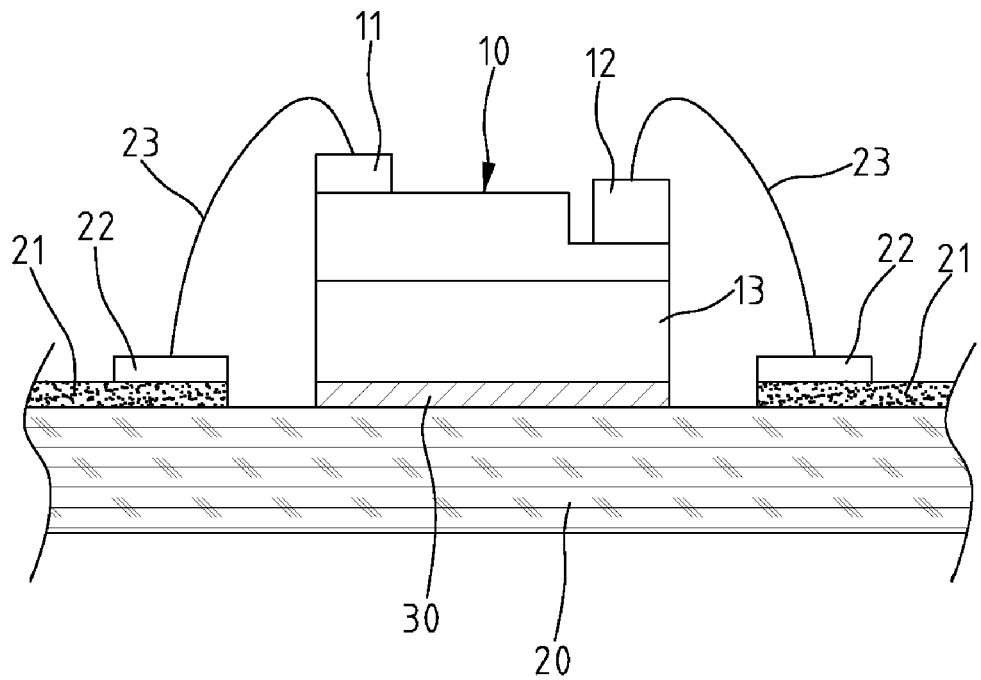
FIG. 1 is a schematic view showing a conventional packaging structure.
Figure 2:
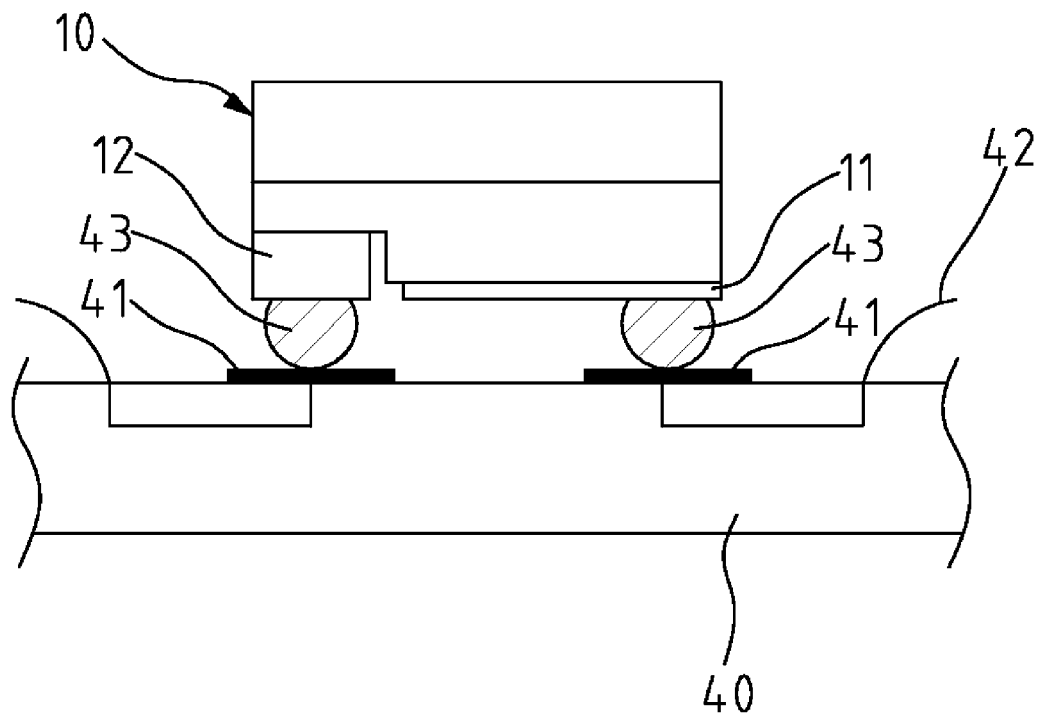
FIG. 2 is a schematic view showing a conventional flip-chip packaging structure.
Figure 3:
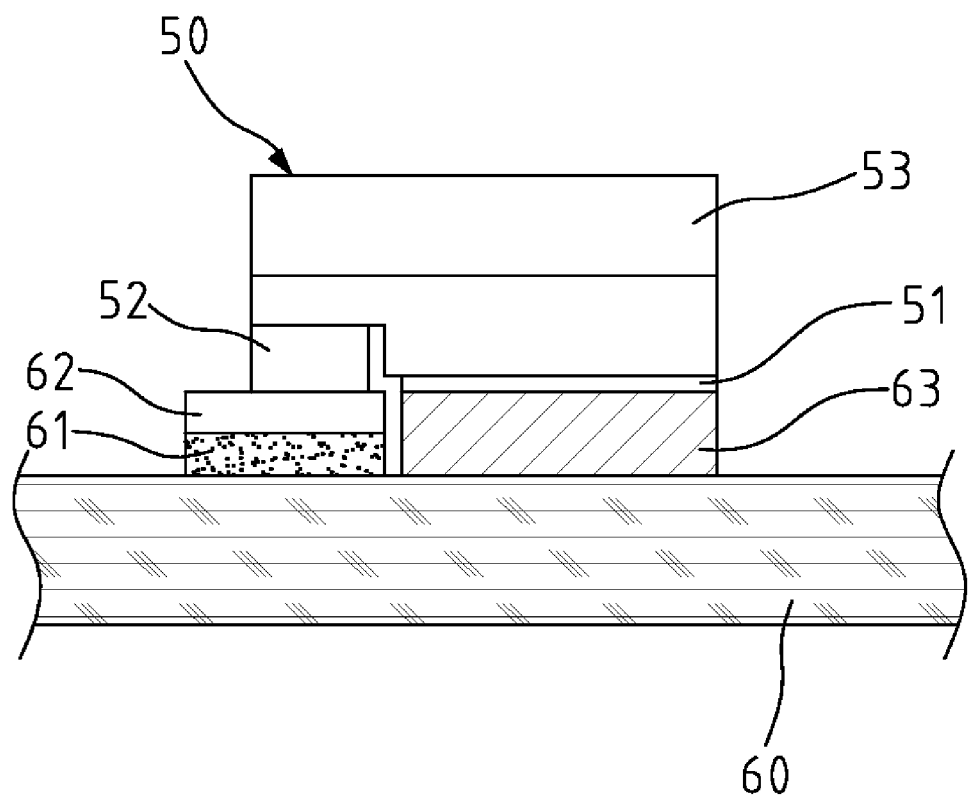
FIG. 3 is a schematic view showing the flip-chip packaging structure according to an embodiment of the present invention.

With reference to the drawings and in particular to FIG. 3, FIG. 3 is a schematic view according to an embodiment of the present invention. As illustrated, the flip-chip packaging structure comprises a LED 50 and a thermal conducting substrate 60, bonded together by a flip-chip technology.

LED 50 comprises a first electrode 51 and a second electrode 52, where the first and second electrodes 51 and 52 are provided on a same side of the LED 50. The first and second electrodes 51 and 52 are made of metals like Ti, Al, or Au formed by physical vapor deposition (PVD) and fusing. For a GaN-based LED die, the first electrode 51 can be joined with the P⁻ GaN layer and functions as the p-type electrode, and the second electrode 52 can be joined with the n⁺ GaN layer and functions as the n-type electrode. Please note that this arrangement of electrodes is exemplary only and there are various other alternatives. Also, during the vapor deposition process, the first electrode 51 can be configured to have a larger area and, together with an appropriate thickness, a more stable bonding and a better thermal conductive interface between the LED 50 and the substrate 60 can be achieved during the subsequent eutectic bonding process. Then, once an appropriate voltage is applied on the first and second electrodes 51 and 52, the LED 50 is turned on.

The thermal conducting substrate 60 can be made of Al (thermal conductivity coefficient 231 W/m·K), Cu (thermal conductivity coefficient 385 W/m·K), or AlN (thermal conductivity coefficient 320 W/m·K). Any other similar material could also be used but those have thermal conductivity coefficient higher than 100 W/m·K at room temperature are preferable. Besides providing heat dissipation, the thermal conducting substrate 60 of the present invention should also have superior electrical conductivity. Therefore, Al and Cu are the most promising candidates for the thermal conducting substrate 60. Before attaching LED 50 to the thermal conducting substrate 60, an insulating layer 61 is formed in a specific area corresponding to the second electrode 52 on the top surface of the thermal conducting substrate 60. The insulating layer 61 can be formed by chemical vapor deposition (CVD) using, but not limited to, $SiO_2$ or $Si_3N_4$. Then, a bonding pad 62 made of an appropriate metallic material is formed on the top surface of the insulating layer 61 for connecting to the second electrode 52. As will be explained later, the first electrode 51 is electrically connected via a eutectic layer 63 to the thermal conducting substrate 60 which is also electrically conductive, there is no need to prepare a second bonding pad or have a bonding wire connected to the first electrode 51 from external circuitry. As to the second electrode 52, its connection to the external circuitry can be achieved by a bonding wire connected to the bonding pad 62.

Then the LED 50 is reversed in the flip-chip style to attach on the thermal conducting substrate 60 using eutectic bonding. The second electrode 52 is in direct contact with the bonding pad 62, and a eutectic layer 63 is formed between the first electrode 51 and the top surface of the thermal conducting substrate 60. As such, the large amount of heat generated by the LED 50 can be quickly conducted through the first electrode 51 and eutectic layer 63 to the thermal conducting substrate 60 and dissipated. In contrast to the conventional approach, most of the light of the LED 50 is radiated out unblocked through the sapphire substrate 53. Most importantly, the heat is conducted through the eutectic layer 63 having a much larger contact area than that of the metallic bumps and a much better thermal conductivity than that of the sapphire substrate 53.

Figure 4:
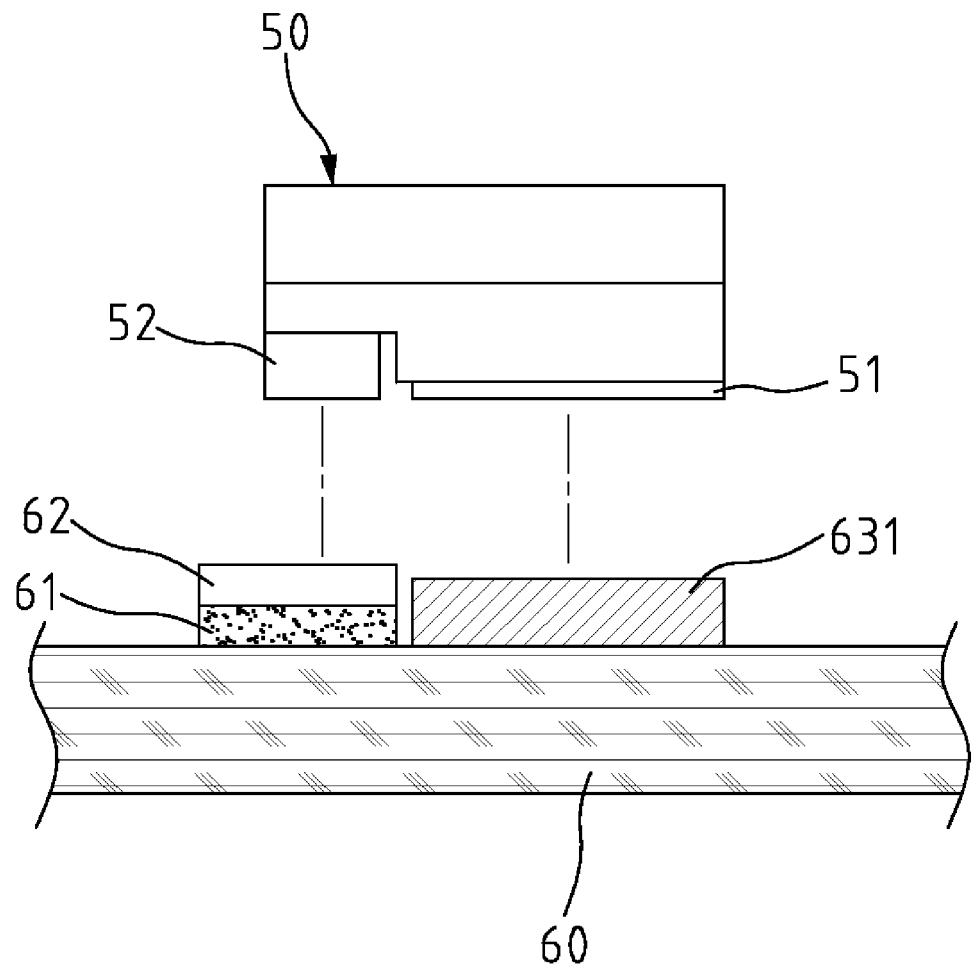
FIG. 4 is a schematic view showing the formation of the eutectic layer according to an embodiment of the present invention.
Figure 5:
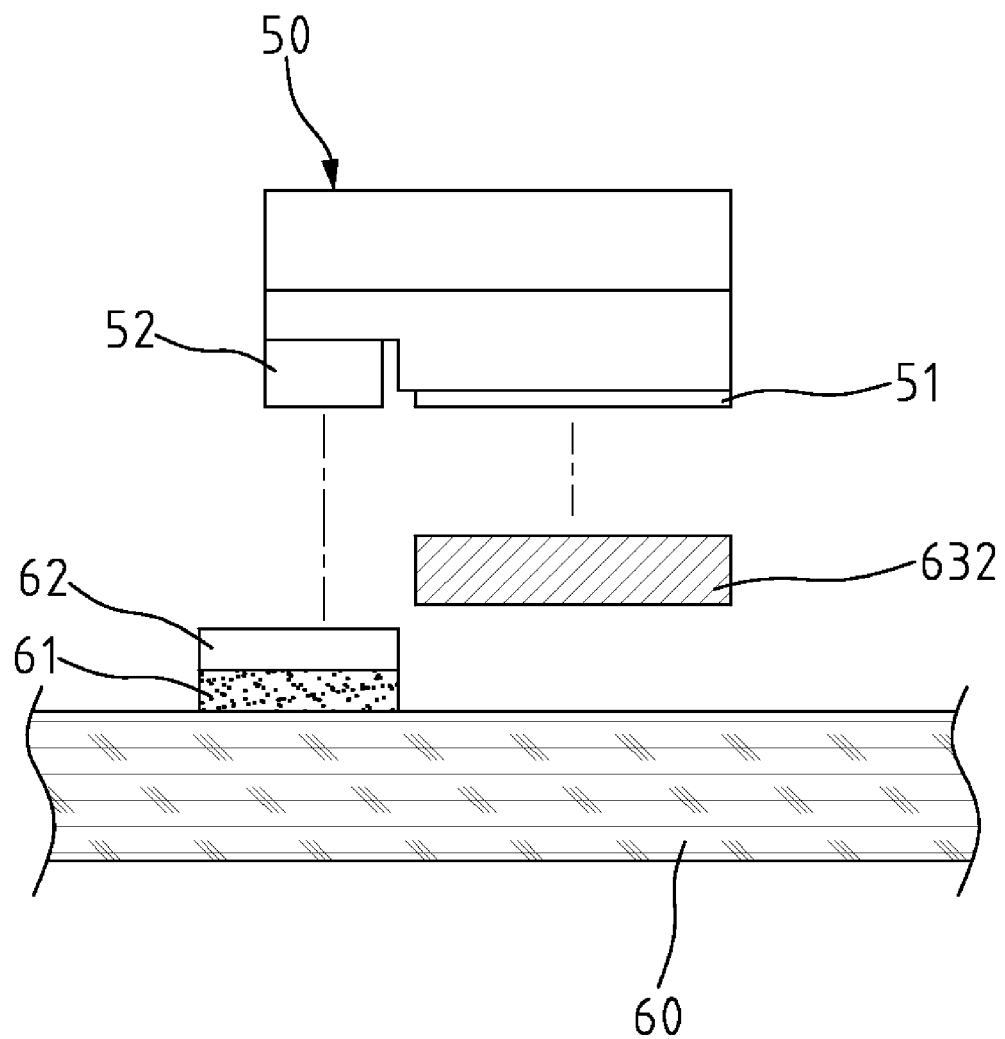
FIG. 5 is a schematic view showing the formation of the eutectic layer according to another embodiment of the present invention.

With reference to the drawings and in particular to FIG. 4 and FIG. 5, FIG. 4 and FIG. 5 are schematic views showing the formation of the eutectic layer 30 according to two embodiments of the present invention. As shown in FIG. 4, a metallic layer 631 made of appropriate materials such as Au and/or Al is plated on the top surface of the thermal conducting substrate 60 corresponding to the first electrode 51 and then the eutectic layer 63 is formed by a eutectic bonding process at appropriate temperature. In an alternative embodiment, as shown in FIG. 5, a metallic plate 632 made of appropriate materials such as Au and/or Al can be positioned between the first electrode 51 and the top surface of the thermal conducting substrate 60. Then the eutectic bonding process is conducted at an appropriate temperature. When the first electrode 51 is made of Cu, the foregoing processes would form a Cu/Au or Cu/Au/Al eutectic layer 63. Please note that the metallic layer 631 and the metallic plate 632 can be made of other appropriate metallic material and those with higher thermal conductivity coefficient are preferable.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A packaging method of a LED having a first electrode and a second electrode on a top side of said LED, comprising the steps of:
   (1) providing a thermal and electrical conducting substrate;
   (2) forming an insulating layer in an appropriate area on the top surface of said substrate, and forming a bonding pad on top of said insulating layer;
   (3) reversing said LED so that said first electrode and said second electrode face the top surface of said substrate; and
   (4) eutectic bonding said LED to said substrate so that a eutectic layer is formed and bonded between said first electrode and an appropriate area not overlapping said insulating layer on the top surface of said substrate, and said second electrode electrically connected to said bonding pad.

2. The packaging method as claimed in claim 1, wherein said thermal conducting substrate made of Al.

3. The packaging method as claimed in claim 1, wherein said thermal conducting substrate is made of Cu.

4. The packaging method as claimed in claim 1, wherein said insulating layer is made of $SiO_2$.

5. The package method as claimed in claim 1, wherein said step (4) further comprising:
   plating a metallic layer in said appropriate area not overlapping said insulating layer before conducting said eutectic bonding.

6. The packaging method as claimed in claim 5, wherein said eutectic layer is eutectic Cu/Au.

7. The packaging method as claimed in claim 5, wherein said eutectic layer is eutectic Cu/Au/Al.

8. The packaging method as claimed in claim 1, wherein said step (4) further comprising:
   interposing a metallic plate between said appropriate area not overlapping said insulating layer and said first electrode before conducting said eutectic bonding.

9. The packaging method as claimed in claim 8, wherein said eutectic layer is eutectic Cu/Au.

10. The packaging method as claimed in claim 8, wherein said eutectic layer is eutectic Cu/Au/Al.

* * * * *